United States Patent [19]
Ochoa et al.

[11] Patent Number: 5,615,158
[45] Date of Patent: Mar. 25, 1997

[54] SENSE AMPLIFIER CIRCUIT FOR DETECTING DEGRADATION OF DIGIT LINES AND METHOD THEREOF

[75] Inventors: Roland Ochoa; Daniel R. Loughmiller, both of Boise, Id.

[73] Assignee: Micron Technology, Inc., Boise, Id.

[21] Appl. No.: 559,195

[22] Filed: Nov. 13, 1995

[51] Int. Cl.$^6$ .................................................. G11C 29/00
[52] U.S. Cl. ......................... 365/201; 365/205; 365/208; 365/190; 365/194; 365/196; 365/189.07; 365/200; 327/52; 327/57
[58] Field of Search ....................... 365/205, 208, 365/201, 190, 194, 196, 189.07, 200; 327/51, 52, 57

[56] References Cited

U.S. PATENT DOCUMENTS

| | | | |
|---|---|---|---|
| 5,042,011 | 8/1991 | Casper et al. ............................ | 365/205 |
| 5,132,575 | 7/1992 | Chern ...................................... | 327/51 |
| 5,175,450 | 12/1992 | Chern ...................................... | 327/51 |
| 5,206,551 | 4/1993 | Chern ...................................... | 327/51 |
| 5,220,221 | 6/1993 | Casper ..................................... | 327/51 |
| 5,235,550 | 8/1993 | Zagar ....................................... | 365/226 |
| 5,245,578 | 9/1993 | McLaury .................................. | 365/203 |
| 5,265,050 | 11/1993 | McLaury .................................. | 365/189.01 |
| 5,285,408 | 2/1994 | Starkweather et al. ............. | 365/189.11 |
| 5,302,870 | 4/1994 | Chern ...................................... | 327/51 |
| 5,305,263 | 4/1994 | Morgan .................................... | 365/190 |
| 5,323,350 | 6/1994 | McLaury .................................. | 365/208 |
| 5,335,202 | 8/1994 | Manning et al. ......................... | 365/222 |
| 5,367,213 | 11/1994 | Casper ..................................... | 327/56 |
| 5,369,622 | 11/1994 | McLaury .................................. | 365/233 |

*Primary Examiner*—David C. Nelms
*Assistant Examiner*—Andrew Q. Tran
*Attorney, Agent, or Firm*—Schwegman, Lundberg, Woessner & Kluth, P.A.

[57] ABSTRACT

To permit effective testing of a sense amplifier circuit, the sense amplifier is designed to be responsive to data stored in a selected memory cell in a controlled test mode. The sense amplifier circuit includes a pull-down circuit having delay circuit to receive and respond to a control signal which indicates whether the sensing circuit is to operate in test mode or normal mode. The sense amplifier circuit also includes an output circuit which is configured and arranged to generate a reference signal corresponding to the data stored in a selected memory cell. To permit sufficient time to test the circuit for correct data values at the output signal, the reference signal is delayed in response to the control signal indicating that the sensing circuit is to operate in test mode.

19 Claims, 3 Drawing Sheets

SENSE AMPLIFIER CIRCUIT FOR DETECTING DEGRADATION OF DIGIT LINES AND METHOD THEREOF

FIELD OF THE INVENTION

The present invention relates generally to semiconductor devices, such as memory chips. More particularly, the present invention relates to memory chips having sense amplifiers which are susceptible to producing faulty output signals.

BACKGROUND OF THE INVENTION

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one or a binary zero.

Conventionally, a DRAM contains one sense amplifier for a designated group (row or column) of memory cells. The sense amplifier senses the voltage level in the selected memory cell of the memory cell group via a pair of digit lines. If the voltage level stored in the memory cell represents a binary zero, one of the digit lines will increase in level and the other digit line will decrease in level. If the voltage level stored in the selected memory cell corresponds to a binary one, a change in the opposite direction occurs. Through this complementary operation, the sense amplifier yields a single output signal which is coupled through an output buffer to an output pin of the DRAM device.

In connection with the present invention, it has been discovered that the output signal from the sense amplifier is often defective, or bordering on being defective, due to one or more circuit problems in the path between the memory cell and the output pad controlled by the output buffer. For example, laboratory testing has shown that such defects are caused by an imbalance in the sections of the sense amplifier which couple to the digit lines, excessive resistivity in a node or metal contact, or a defect in a poly layer.

Detecting such defects before the DRAM circuit is encapsulated as part of the final product is important, because the only remedy to such a problem when it is detected after packaging is the disposal of the device. By detecting such defects before packaging, spare (or redundant) memory cells and/or sense amplifiers can be used to replace the defective circuits, for example, using conventional laser fusing equipment.

Accordingly, there is a need for an improved method and circuit arrangement that overcomes the above-mentioned deficiencies and increases the yield of memory devices during the manufacturing process. The present invention provides a solution to these and other problems, offering advantages over conventional implementations.

SUMMARY OF THE INVENTION

In an exemplary embodiment of the present invention, a sense amplifier circuit is responsive to data stored in a selected memory cell in a controlled test mode. The sense amplifier circuit includes pull-down circuit having a delay circuit receiving and responding to a control signal which indicates whether the sensing circuit is to operate in test mode or normal mode. The sense amplifier circuit also includes an output circuit which is configured and arranged to generate a pull-down reference signal corresponding to the data stored in a selected memory cell. To permit effective testing of the circuit in the test mode, the output signal is delayed in response to the control signal indicating that the sensing circuit is to operate in test mode.

In another exemplary embodiment, the present invention provides a semiconductor memory device, such as a DRAM, including the above-described sensing circuit. The semiconductor memory device includes: a memory array including a multitude of memory cells; a control circuit configured and arranged to access selected ones of the memory cells; an output buffer presenting an output signal corresponding to data stored in a selected memory cell; and the sensing circuit configured and arranged between the memory array and the output buffer.

In yet another embodiment, the present invention provides a method for testing the above-described semiconductor memory device. The method includes: generating the control signal; providing an electronic probe to measure a power-related parameter of the output signal; using the electronic probe to measure the output signal in response the control signal being generated; comparing the power-related parameter to a criterion; and, in response to the step of comparing, determining whether or not the semiconductor memory device is acceptable. Redundant circuitry can be used to replace the failed circuitry before completing the packaging of the semiconductor device.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention may become apparent upon reading the following detailed description and upon reference to the drawings in which.

Figure 1B:
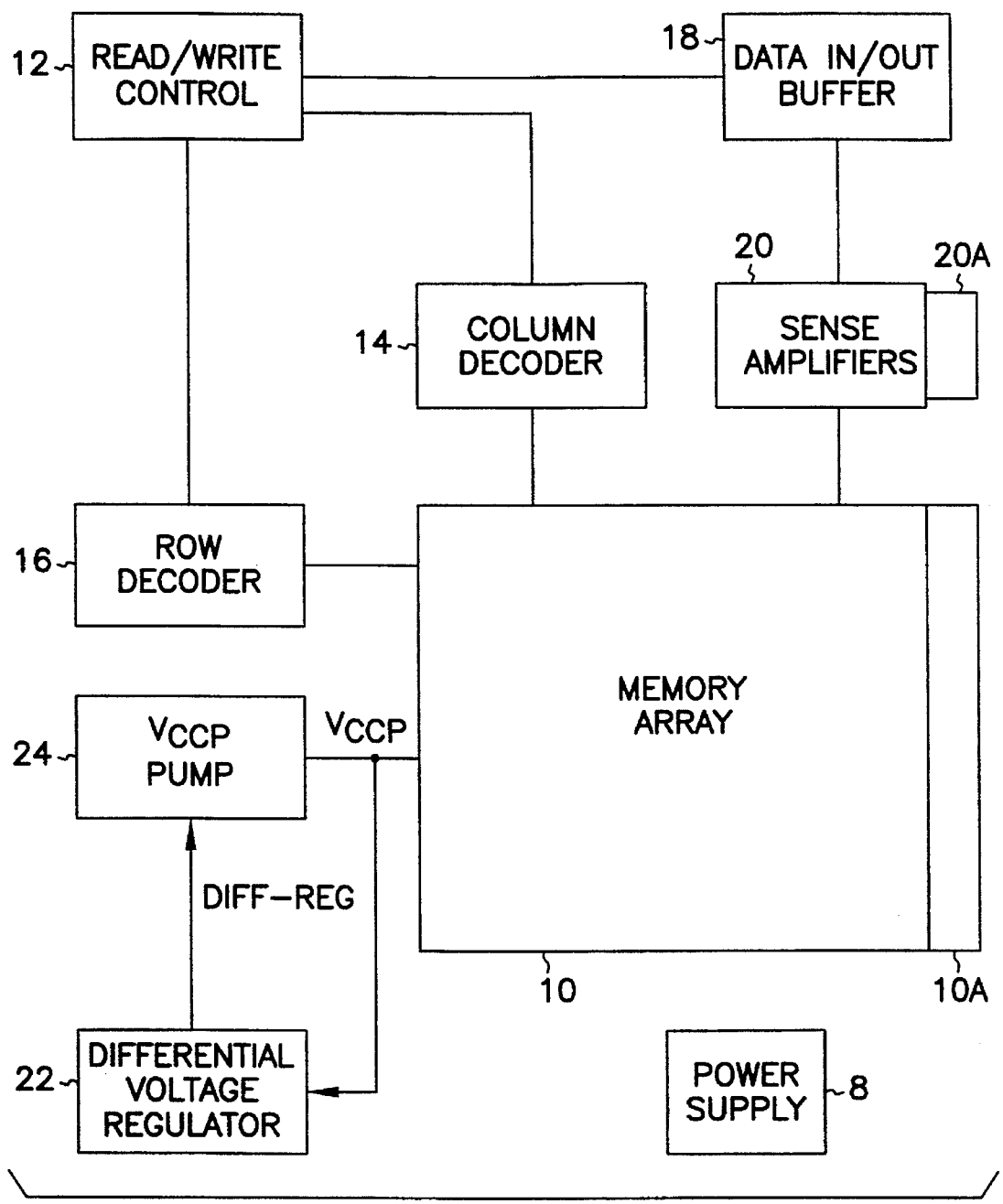
FIGS. 1A and 1B illustrate a DRAM device from a perspective view (FIG. 1A) and in the form of a block diagram (FIG. 1B), both exemplifying a semiconductor DRAM device implemented in accordance with the principles of the present invention.

While the invention is susceptible to various modifications and alterative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

Figure 1A:
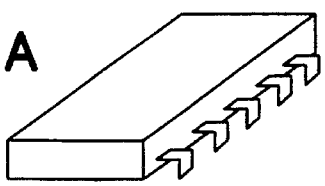

Turning now to the drawings, FIG. 1A illustrates a semiconductor DRAM device after it is constructed, tested and packaged for shipment. FIG. 1B illustrates a block diagram of the DRAM device of FIG. 1A. The block diagram exemplifies an embodiment constructed for proper testing of the DRAM device in accordance with the principles of the present invention.

In FIG. 1B, a conventional power supply 8 provides power signals, such as Vcc, to power a memory array 10 and related memory access circuits. The memory array 10 consists of a number of individual memory cells or transistors organized in rows and columns. Each memory cell can hold one of two states, corresponding to binary zero and binary one. For a data access (read or write) operation to be performed upon a particular memory cell within the array, a read/write control circuit 12 provides the row address of the cell to a row decoder 16 and the column address of the cell to a column decoder 14. Data in/out buffers 18 are used provide an interface for the data between the selected memory cell and external data (input/output) ports (not shown), which are coupled to the buffers 18. Sense amplifiers 20, which are directed by the read/write control circuit 12, are used to convert the information provided by the selected memory cell to the appropriate voltage level for the data in/out buffer 18. Control over the timing and direction of data flow is provided by the read/write control circuit 12. As described further below, redundant memory cell groups 10A and redundant sense amplifier circuits 20A are used during the manufacturing process as replacement circuitry in the event that the semiconductor DRAM device is tested and determined to be defective is these circuit areas.

Apart from the certain aspects of the sense amplifiers, which are discussed below in connection with FIGS. 3A and 3B, each of the above circuit types is well known in the art. Reference may be made, for example, to U.S. Pat. No. 5,335,202, which issued on Aug. 2, 1994, and U.S. Pat. No. 5,042,011, which issued on Aug. 20, 1991.

Figure 2:
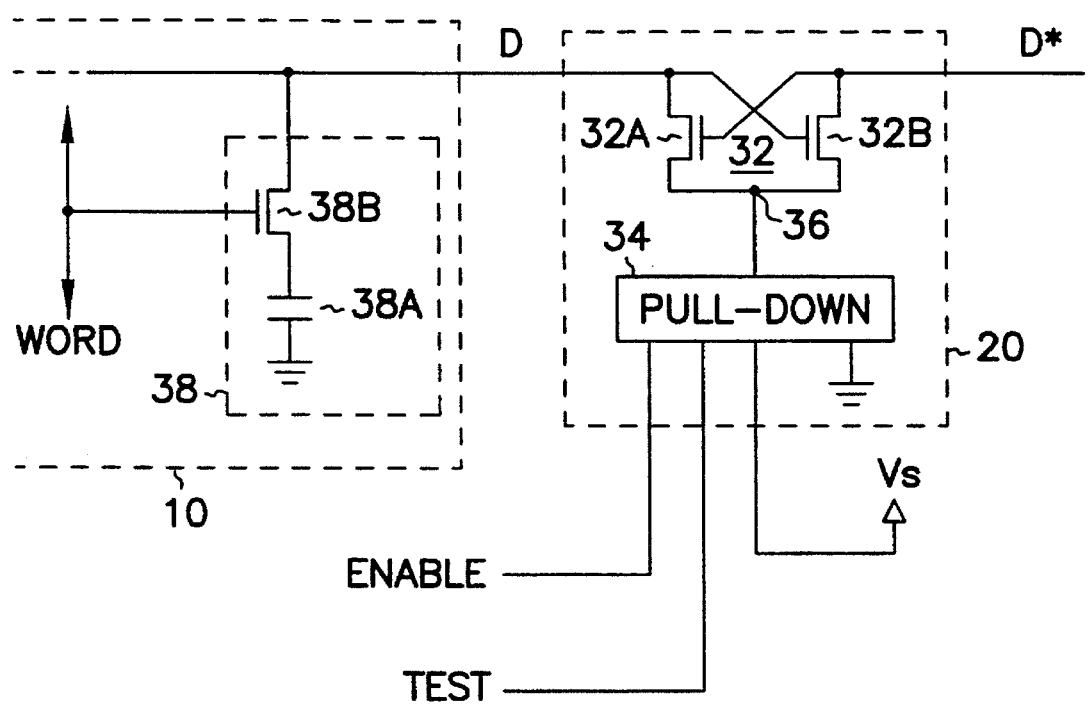
FIG. 2 illustrates an expanded block diagram of the sense amplifier of FIG. 1.

As illustrated in FIG. 2, each sense amplifier 20 of FIG. 1B can be viewed as sensing and amplifying a pair of complementary digit lines, D and D*, using a central circuit 32 and a pull-down circuit 34. The read/write control 12 generates a control signal ("WORD") to select a memory cell 38, and generates an enable signal ("ENABLE") to permit the sense amplifier to bias the digit lines for coupling to the output buffer contained within data in/out buffer 18 of FIG. 1B. The signals D and D*, when no memory cell is selected, are equal and set by the voltage of an internal reference. Once a memory cell is selected, however, a slight voltage difference is created between D and D* signals which represent the polarity (binary one or binary zero) of the data stored in the selected memory cell 38. The slight voltage difference results from the charge stored on capacitor 38A being transferred to one of the digit lines D or D*. Thus, when there is a charge on the capacitor 38A, the voltage at D is raised to a level slightly higher than the voltage at D*; conversely, when there is no charge on the capacitor 38A, the voltage at D is reduced to a level slightly lower than the voltage at D*.

As mentioned, the sense amplifier senses and amplifies the slight voltage difference in D and D* through interaction of the central circuit 32 and the pull-down circuit 34. The purpose of the pull-down circuit 34, discussed in detail below, is to provide a reference voltage at node 36 which corresponds to the lower of the two voltages at signals D and D*. This causes only one of the two central circuit transistors 32A and 32B to activate and amplify the difference between the digit lines.

For example, when there is a slight charge in the capacitor 38A of selected memory cell 38, the voltage on D is expected to be slightly higher than the voltage on D*. At this time, which is prior to enablement of the pull-down circuit, the voltage at node 36 is high. When enabled, the pull-down circuit 34 causes the reference voltage at node 36 to be pulled to ground. This, in turn, causes transistor 32A to remain in the nonconducting state and transistor 32B to conduct, thereby pulling the voltage at D* to ground. When the voltage at node 36 drops, this does not activate transistor 32A because the voltage drop also occurs at D*, which is the input to the gate of transistor 32A. Because substrate ground is typically substantially below the lower of the two voltages at signals D and D*, the consequential action of the sense amplifier 20 is to amplify the difference in voltage level between the complementary digit lines D and D*.

Conversely, when there is no charge in the capacitor 38A of selected memory cell 38, the voltage on D is expected to be slightly lower than the voltage on D*.

Because the voltage difference between the digit lines D and D* is often so slight, testing the circuitry leading from the memory cell is important. This is especially true in low voltage applications where even slight imperfections in the manufacturing process can result in erroneously sensed data. To accommodate this concern, the sense amplifier shown in FIG. 2 is specially designed to respond to a test control signal (TEST), which permits such testing of circuitry in the path between the memory cell and output buffer.

Figure 3A:
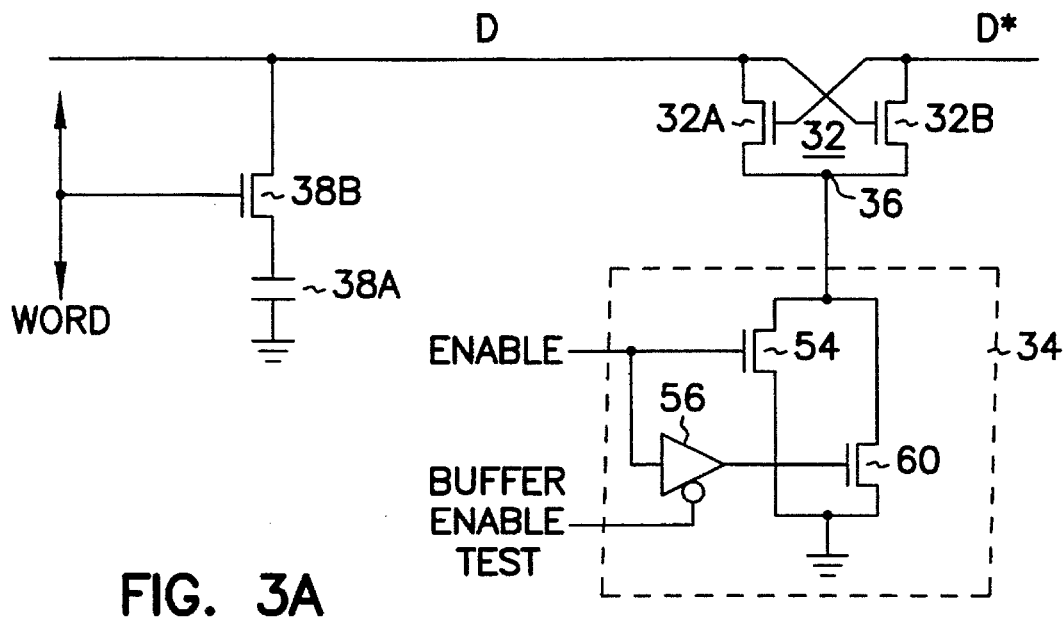
FIG. 3A illustrates the sense amplifier of FIG. 2 with additional detail directed to a pull-down circuit for a sense amplifier in accordance with the principles of the present invention.

Turning now to FIG. 3A, the pull-down circuitry 34 of FIG. 2 is shown in detail. The pulldown enable signal (ENABLE) is shown controlling the gate of a transistor 54 and, via a tri-state buffer gate 56, the gate of transistor 60.

Unlike prior art pull-down circuits, the pull-down circuit 34 of FIG. 3A provides for an easily-implemented test circuit. This test circuit, which can be used to test many, if not all, aspects of the memory cell path, includes a test buffer enable control signal (TEST) enabling the output of buffer 56. During the test mode, this buffer enable signal is forced low to maintain transistor 60 in its non-conducting state. The output of buffer 56 provides an enable output signal to control the transistor 60.

Figure 3B:
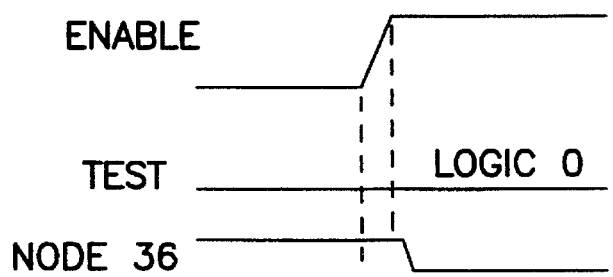
FIG. 3B illustrates a timing diagram corresponding to the operation of the circuit shown in FIG. 3A when it is operating in normal conditions.
Figure 3C:
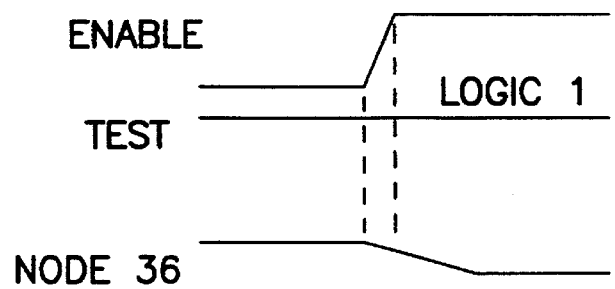
FIG. 3C illustrates a timing diagram for the circuit of FIG. 3A corresponding to a test mode operation.

The timing diagrams of FIGS. 3B and 3C illustrate the operation of the circuitry and control signals for both the normal mode and the test mode. In each of FIGS. 3B and 3C, the timing diagram includes three timing lines. These timing lines respectively correspond to the enable signal, the buffer enable signal and the signal at node 36.

Referring first to FIG. 3B, which illustrates the timing diagram for operating in the normal mode, the enable and buffer enable control signals control the transistors 54 and 60 to activate substantially simultaneously in response to the ENABLE signal going high. This forces the transistors 54 and 60 to conduct, thereby causing the logic high level voltage at node 36 to be pulled rapidly to ground. The timing diagram at the bottom of FIG. 3B illustrates the rapid discharging of the voltage level at the node 36. The rate of the discharge is determined in part by the intrinsic capacitance at the node 36, the initial capacitance provided by the transistors 54 and 60 in their non-conducting states, and the resistance provided by the transistors 54 and 60 once they are in their conducting states. Except for the presence of the buffer enable signal, this timing diagram is conventional.

In FIG. 3C, a timing diagram for these same signals is shown for the test mode. The difference between the diagrams of FIGS. 3B and 3C is reflected in the bottom two timing lines, corresponding to the buffer enable signal and the signal at node 36. By maintaining the buffer enable signal at a logic high level for the entire timing cycle when the signal at node 36 transits to a logic high level, only transistor 54 conducts. The transistor 60 remains non-conducting, thereby substantially reducing the drive at the node 36. This causes the logic high level voltage at node 36 to be pulled relatively slowly to substrate ground.

The timing line at the bottom of FIG. 3C illustrates this slow discharge of the voltage level at the node 36. By sizing the transistors 54 and 60 relative to one another, the discharge rate can be optimized.

Further, because an increased discharge time of the signal at the node 36 is known to detect faulty memory cell paths, any slight imperfection in the cell path or imbalance in the sense amplifier is readily detected by an incorrect sensing of the stored data via the data present at the data out buffer 18. Corrective action includes replacing the memory cell using a redundant row or column of memory cells, and retesting, as described above, before packaging (encapsulating) the circuitry.

The foregoing description, which has been disclosed by way of the above examples and discussion, addresses embodiments of the present invention encompassing the principles of the present invention. The embodiments may be changed, modified and/or implemented using various circuit types and arrangements. Those skilled in the art will readily recognize that these and various other modifications and changes may be made to the present invention without strictly following the exemplary embodiments and applications illustrated and described herein, and without departing from the true spirit and scope of the present invention which is set forth in the following claims.

What is claimed is:

1. A sense amplifier circuit responsive to data stored in a selected memory cell, the sense amplifier circuit comprising:
   an amplifier responsive to a signal representing the data stored in the selected memory cell; and
   a pull-down circuit, coupled to said amplifier, having
      a delay circuit responsive to a control signal indicating whether the sense amplifier circuit is to operate in a test mode or a normal mode,
      an output circuit configured and arranged to generate a pull-down reference signal corresponding to the data stored in the selected memory cell, the pull-down reference signal delayed in response to the control signal indicating that the sense amplifier circuit is to operate in the test mode.

2. A sense amplifier circuit, according to claim 1, wherein the delay circuit further includes a drive circuit which is de-activated in response to the control signal.

3. A sense amplifier circuit, according to claim 2, wherein the drive circuit includes a transistor configured and controlled to provide a selected level of drive to the pull-down reference signal.

4. A sense amplifier circuit, according to claim 2, wherein the delay circuit, in response to the control signal, provides an expected time delay in a transition of the pull-down reference signal.

5. A sense amplifier circuit, according to claim 3, wherein the delay circuit, in response to the control signal, provides an expected time delay in a transition of the pull-down reference signal.

6. A sense amplifier circuit, according to claim 1, wherein the signal representing the data stored in the selected memory cell is provided on a pair of digit lines.

7. A sense amplifier circuit, according to claim 1, wherein the delay circuit includes a transistor circuit configured and controlled to provide a drive to the pull-down reference signal in the test mode, and configured and controlled to substantially reduce said drive to the pull-down reference signal in the normal mode.

8. A sense amplifier circuit, according to claim 1, wherein the output circuit is further configured and arranged to respond to a second control signal indicating that the sense amplifier circuit is enabled to generate the pull-down reference signal.

9. A sense amplifier circuit, according to claim 1, wherein the signal representing the data stored in the selected memory cell is provided on a pair of digit lines, and the pull-down reference signal is used as a reference signal for the sense amplifier circuit.

10. A semiconductor memory device including the sense amplifier circuit of claim 1, the semiconductor memory device comprising:
   a memory array including a multitude of memory cells;
   a control circuit configured and arranged to access selected ones of the memory cells;
   an output buffer presenting an output signal corresponding to data stored in the selected memory cell; and
   the sense amplifier circuit configured and arranged between the memory array and the output buffer.

11. A semiconductor memory device, according to claim 10, wherein the control circuit is configured and arranged to generate the control signal.

12. A method for testing the semiconductor memory device of claim 10, the method comprising:
   generating the control signal; sensing the data stored in the selected memory cell;
   comparing the data present at the output buffer to a predetermined data; and
   in response to the step of comparing, determining whether or not the semiconductor memory device is faulty.

13. A method, according to claim 12, further including the step of repairing the semiconductor memory device in response to the step of determining that the semiconductor memory device is faulty.

14. A method, according to claim 13, wherein the step of repairing the semiconductor memory device further includes replacing faulty circuitry with redundant circuitry.

15. A semiconductor memory device, comprising:
   a memory array including a multitude of memory cells;
   a control circuit configured and arranged to access selected ones of the memory cells;
   an output buffer presenting an output signal corresponding to data stored in a selected memory cell;
   a sensing circuit, coupled between the memory array and the output buffer, and having a pull-down circuit including
      a first input port receiving a memory signal representing data stored in the selected memory cell, a second input port receiving an output command signal commanding the data in the selected memory cell to be coupled to the output buffer, a third input port receiving a control signal indicating whether the sensing circuit is to operate in test mode or normal mode, a reference port generating a reference signal corresponding to the memory signal; and the sensing circuit configured and arranged to delay the change in the reference signal in response to the control signal indicating that the sensing circuit is to operate in test mode.

16. A semiconductor memory device, according to claim 15, wherein the first input port feeds first and second transistors receiving a pair of differential memory input signals representing the data in the selected memory cell.

17. A semiconductor memory device, according to claim 16, wherein the sensing circuit includes a first circuit path including the first transistor and a second circuit path including the second transistor.

18. A semiconductor memory device, according to claim 17, wherein each of the first and second circuit paths is coupled to a drive circuit configured and arranged to add a drive to the reference signal in response to the control signal indicating that the sensing circuit is to operate in test mode.

19. A semiconductor memory device, according to claim 15, further including a test pad configured and arranged to receive the control signal.

* * * * *